United States Patent [19]

Frisch et al.

[11] Patent Number: 5,047,114
[45] Date of Patent: Sep. 10, 1991

[54] PROCESS FOR THE PRODUCTION OF METAL CLAD THERMOPLASTIC BASE MATERIALS AND PRINTED CIRCUITS ON THERMOPLASTIC BASE MATERIALS

[75] Inventors: David C. Frisch, Baldwin; Wilhelm Weber, Hicksville, both of N.Y.

[73] Assignee: AMP-AKZO Corporation, Newark, Del.

[21] Appl. No.: 314,250

[22] Filed: Feb. 21, 1989

Related U.S. Application Data

[63] Continuation of Ser. No. 80,244, Jul. 27, 1987, abandoned, which is a continuation of Ser. No. 703,942, Feb. 21, 1985, abandoned, which is a continuation-in-part of Ser. No. 667,884, Nov. 2, 1984, abandoned.

[51] Int. Cl.⁵ .................. B32B 31/20; B32B 31/26
[52] U.S. Cl. .................. 156/630; 156/308.2; 156/309.6; 156/309.9; 156/322; 156/902
[58] Field of Search ............. 156/272.2, 273.5, 309.9, 156/322, 629, 630, 668, 902, 153, 308.2, 309.6, 281; 428/901, 137; 204/13, 30, 31, 38.4; 174/68.5

[56] References Cited

U.S. PATENT DOCUMENTS

| | | | |
|---|---|---|---|
| 3,661,675 | 5/1972 | Frankowski | 156/308.2 X |
| 3,767,538 | 10/1973 | Politycki et al. | 204/38.4 X |
| 3,772,078 | 11/1973 | Polichette et al. | 204/38 B X |
| 3,809,591 | 5/1974 | Vogelfanger et al. | 156/308.2 X |
| 3,930,963 | 1/1976 | Polichette et al. | 204/15 |
| 3,953,663 | 4/1976 | Kelhm, Jr. | 174/68.5 |
| 3,959,547 | 5/1976 | Polichette et al. | 428/209 |
| 3,994,727 | 11/1976 | Polichette et al. | 427/98 X |
| 4,022,648 | 5/1977 | Woodberry et al. | 156/308.2 X |
| 4,048,005 | 9/1977 | Nakagome et al. | 156/902 X |
| 4,339,303 | 7/1982 | Frisch et al. | 156/629 |
| 4,424,095 | 1/1984 | Frisch et al. | 156/272.2 X |

OTHER PUBLICATIONS

Naegle, Peter J., "Polysulfone: Its Microwave Properties", presented at IPC Annual Meeting, IPC-TO-319, Apr. 1980.

Going, Timothy J., "Polyetherimide: A New High Performance Polymer for Printed Circuit Applications", ASEP Annual Mtg., Oct. 1982.

Primary Examiner—Caleb Weston
Assistant Examiner—Adrienne C. Johnstone
Attorney, Agent, or Firm—Morgan & Finnegan

[57] ABSTRACT

A process for bonding metal directly to thermoplastic polymeric base materials and a process for producing printed circuits from such metal clad thermoplastic polymeric base materials are provided. The invention also includes the articles so produced. Metal clad thermoplastic polymeric base materials are produced by laminating a metal foil or sheet to thermoplastic polymeric base material, under pressure, at a temperature from about 2° C. to about 45° C. above the glass transition temperature (Tg) of the thermoplastic. The polymeric material is free of volatile materials such as moisture or solvents when laminated.

6 Claims, 2 Drawing Sheets

PROCESS FOR THE PRODUCTION OF METAL CLAD THERMOPLASTIC BASE MATERIALS AND PRINTED CIRCUITS ON THERMOPLASTIC BASE MATERIALS

This is a continuation of co-pending application Ser. No. 07/080,244, filed on July 27, 1987, now abandoned, which in turn is a continuation of U.S. Ser. No. 06/703,942, filed Feb. 21, 1985, now abandoned, which in turn is a continuation-in-part of U.S. Ser. No. 06/667,884, filed Nov. 2, 1984, now abandoned.

BACKGROUND OF THE INVENTION

1. Field of the Invention

This invention relates to laminating a metal foil or sheet to a thermoplastic polymer substrate at a preselected temperature and to the articles produced thereby. More specifically, this invention relates to the manufacture of printed circuits, and especially to printed circuits produced by subtractive processes on engineering thermoplastic base materials.

2. Description of the Prior Art

High temperature engineering thermoplastics, such as polysulfones, polyethersulfones, polyarylsulfones and, polyetherimides, having excellent dielectric properties. Many processes have been proposed for producing printed circuits on such thermoplastic materials to take advantage of their dielectric insulating properties.

Printed circuits have been produced on high temperature engineering thermoplastics by the semi-additive process. In the semi-additive process, an extruded thermoplastic sheet is provided with holes, annealed, adhesion promoted, electrolessly plated with a thin layer of copper, and printed with a negative resist image. The exposed circuit pattern is electroplated with copper, and then the resist and underlying thin copper film is removed.

Printed circuits also have been produced on these adhesion promoted thermoplastic materials by the additive process using the imaging processes of Polichette et al., U.S. Pat. Nos. 3,722,078; 3,930,963; 3,959,547 and 3,994,727.

Over ninety percent of all printed circuits produced in the United States are manufactured by subtractive processes. Most subtractive processing starts with a copper clad base material. Subtractive printed circuit manufacturing facilities do not have additive or semi-additive manufacturing capabilities.

Since 1975, the printed circuit industry has sought high temperature thermoplastics as base materials. See, e.g., *Modern Plastics*, June 1975, pp. 52-54, "New Day Dawns for Circuit Boards". Widescale manufacture to fill this need has not been possible due to the lack of suitable copper clad, high temperature, thermoplastic base materials.

Naegle, IPC-TP-319, the Institute for Interconnecting and Packaging Electronic Circuits, Evanston, Illinois, April 1980, "Polysulfone: Its Microwave Properties", describes two types of copper clad polysulfone. In one type, copper foil is directly bonded to a polysulfone sheet. However, Naegle does not describe how this direct bonded copper clad polysulfone was prepared, and it has not been made available commercially. In the second type, copper foil is bonded to the polysulfone substrate by an intermediate layer of prepreg, epoxy resin impregnated glass cloth. The adhesion of the copper foil to the base material is superior in this second type, but all other properties are described as inferior. The second type was commercially available, but it was subsequently withdrawn from the market.

Going, "Polyetherimide: A New High Performance Polymer for Printed Circuit Applications", October 1982 Meeting American Society for Electroplated Plastics, describes the formation of copper clad polyetherimide substrates. Going recommends laminating copper foil to a polyetherimide base material at temperatures of 260° C. to 288° C. and pressures of 3.5 MPa (500 psi) or less. The copper-polyetherimide base material produced by this procedure is not completely satisfactory, due to the stress and flow of the resin during lamination. The laminate has a tendency to warp after subtractive printed circuit processing and to have thickness variations from place to place on the base material.

SUMMARY OF THE INVENTION

1. Objects of the Invention

It is an object of this invention to provide an improved process for the manufacture of metal clad thermoplastic laminates.

An object of this invention is to provide a process for producing etched metal patterns on thermoplastic substrates.

It also is an object of this invention to provide an improved process for the manufacture of printed circuits on thermoplastic base materials.

It is an object of this invention to provide a process for the manufacture of printed circuits on base materials with dielectric constants from 3 to 4.

It is a further object of this invention to provide a method of manufacturing printed circuits for high frequency and microwave applications.

2. Definitions

By the term "high temperature thermoplastic" is meant a polymer article having an aromatic backbone that does not liquify or decompose when exposed for 5 seconds to molten solder at 245° C.

By the term "heat distortion temperature" is meant the deflection temperature of a polymer under flexural load measured by the ASTM Standard D 648 at a 1.82 MPa load.

The terms "base material", "printed circuit", "printed circuit board", "flexible printed wiring", "fully-additive process", "semi-additive process" and "subtractive process" have the meaning assigned by ANSI/IPC-T-50B, The Institute for Interconnecting and Packaging Electronic Circuits, "Terms and Definitions for Interconnecting and Packaging Electronic Circuits", June 1980, incorporated herein by reference.

3. Brief Description of the Invention

This invention comprises a process for preparing a metal clad thermoplastic resin substrate which process includes the steps of: (1) providing a low volatiles content thermoplastic unclad resin substrate; (2) laminating a metal layer to the surface of the thermoplastic substrate at a temperature between about 2° C. and about 45° C. above the glass transition temperature (Tg) of the thermoplastic substrate; and (3) stress relieving the metal clad thermoplastic laminate. The invention also includes processes for making metal etched patterns including printed circuits from such laminates. The laminates produced by this process do not warp in processing and are produced with an overall uniform thickness.

4. Brief Description of the Drawings

5. Detailed Description of the Invention

Figure 1:
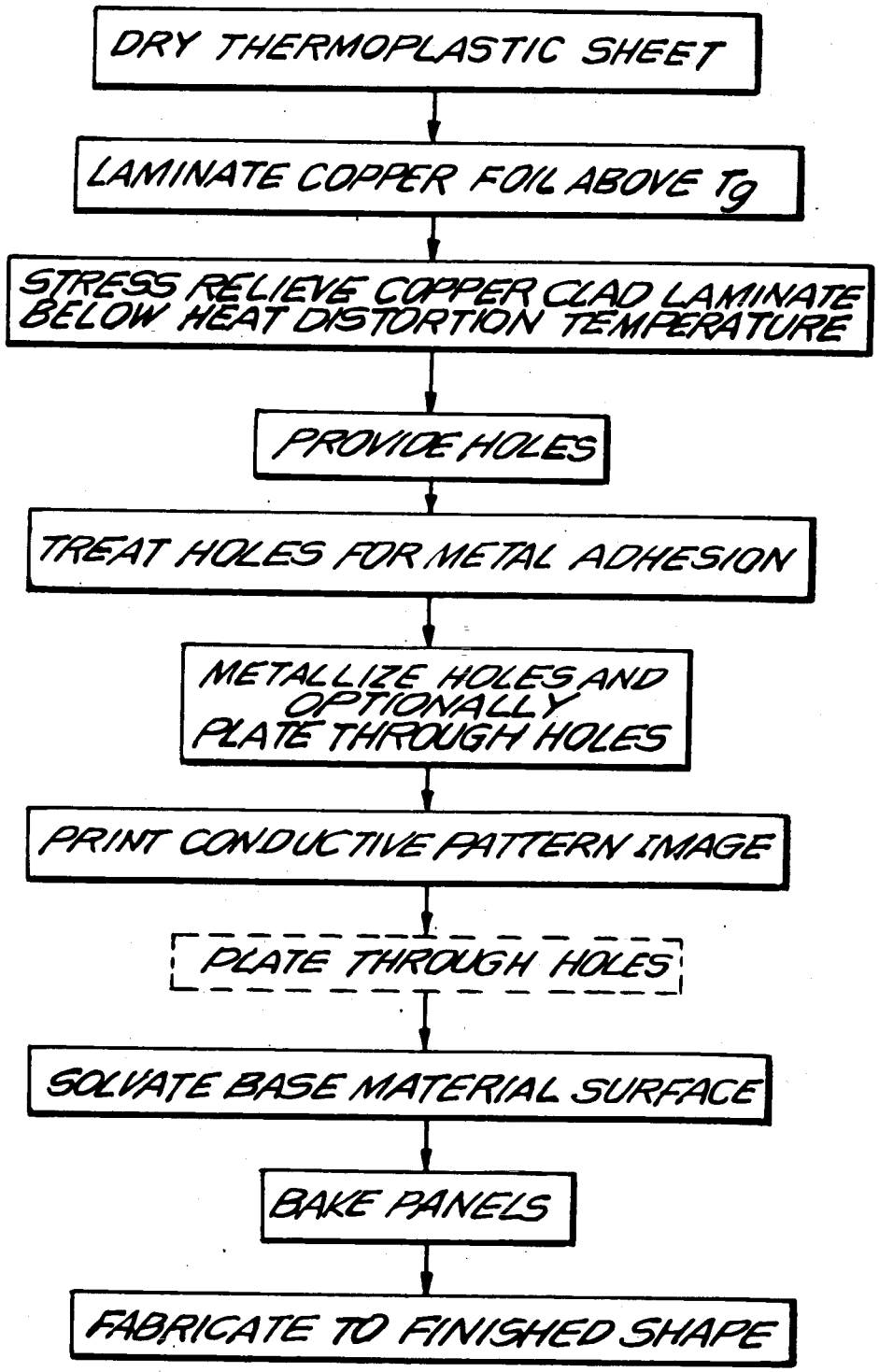
FIG. 1 is a flow chart of the manufacture of printed circuits from the metal clad laminates.

In one aspect, this invention relates to a process for the production of a metal clad thermoplastic polymer substrate comprising the steps of:

providing a thermoplastic polymer film or sheet having an absorbed volatiles content below about 0.1%, said volatiles having boiling points below about 245° C.;

providing a metal foil or sheet;

superimposing said metal foil or sheet on said thermoplastic polymer film or sheet; and consolidating the assembly so produced by applying pressure to the assembly, at a temperature between about 2° C. and about 45° C. above the glass transition temperature (Tg) of the thermoplastic polymer, for a time period sufficient to firmly laminate the metal foil or sheet to the thermoplastic polymer film or sheet.

In another aspect, this invention relates to a subtractive process for the preparation of etched metal patterns or printed wiring on thermoplastic polymer base materials which process comprises the steps of:

providing an annealed metal clad thermoplastic substrate;

forming at least one plated-through hole in said substrate;

forming an image of the conductive pattern on the substrate;

removing unwanted portions of the clad metal;

contacting the substrate with a solvent in which the base material is at least partially soluble for a time period sufficient to permit the solvated base material to flow against and adhere to the edges of the metal pattern, but insufficient to permit the solvated base material to flow onto the metal pattern; and immediately evaporating the solvent from the surfaces of the base material at a temperature at which the solvent rapidly volatilizes to stop said flow, leaving the edges of the conductive pattern adhered to the surfaces of the base material at their intersection.

According to the process of this invention, the concentration of volatiles which may be absorbed in the thermoplastic substrate, the volatiles having boiling points below about 245° C., are reduced or controlled before laminating a metal layer to the substrate. Preferably, the concentration is reduced or controlled to about 0.1% or less. Volatiles are removed or controlled include residual moisture and/or solvent present in the thermoplastic polymer substrate. Volatiles may be removed by heating the substrate at a temperature above 100° C. for at least 30 minutes, or moisture may be removed or controlled by storing the article for at least two weeks, preferably for at least three weeks, at a relative humidity below 50%, or by combinations thereof. The time and temperature for heating or the time for storage at relative humidity below 50% will depend on the thickness of the substrate, how many substrates are stacked together, and/or how they are arranged for exposure to heat or low humidity.

Preferably, the volatiles may be removed by heating the thermoplastic polymer at a temperature above 100° C., more preferably above 110° C. and below 165° C., most preferably below 130° C. for a time period greater than 30 minutes, preferably between about 2 hours and about 24 hours. For low temperature thermoplastic polymer sheets with heat distortion temperatures below 110° C., the volatiles preferably are removed by heating the polymer sheet at a temperature between about 65° C. and its heat distortion temperature.

Lamination pressure is applied to the assembly, at a temperature between about 2° C. and about 45° C., preferably between about 15° C. and about 35° C., above the glass transition temperature of the thermoplastic polymer. The time period for such lamination is between about 1 and about 60 minutes, preferably between about 3 and about 30 minutes. Conventional laminating pressures are employed, i.e., between about 1 MPa and about 10 MPa, preferably between about 3 and about 7 MPa. The lamination pressure may be applied by any known method, i.e., hydraulic presses such as hydraulic platen presses, pressurized gas presses, roll presses, vacuum presses and pressurized gas assisted vacuum presses. After the metal layer has been laminated to the thermoplastic polymer base material, the laminate is flat (not warped) and of substantially uniform thickness. When a metal pattern or printed wiring is etched on such a metal clad thermoplastic substrate, it may crack, craze and/or become warped. Therefore, in the preferred form of this invention, before converting the metal clad thermoplastic base material into a metal etched pattern or a printed circuit, the metal clad base material is relieved of internal stresses by raising it to a temperature at or just below the heat distortion temperature of the thermoplastic polymer comprising the base material. This may be conveniently accomplished directly after forming the metal clad base material. The metal clad laminate or a stack of metal clad laminates is preferably restrained between two flat surfaces during the stress relieving step, but only a slight pressure is applied, which pressure is sufficient to keep the flat surfaces in contact with the metal clad laminate.

The strength of the bonds between copper foil and high temperature thermoplastic sheets which had been laminated and stress relieved by the process of this invention was measured. The results are shown in the Table below.

| Thermoplastic Polymer | Bond Strength (kg/mm) |
|---|---|
| Polysulfone | 0.09–0.13 |
| Polyethersulfone | 0.09–0.13 |
| Polyetherimide | 0.14–0.25 |

For illustrative purposes, the process of this invention is described below in connection with the preparation of a printed circuit. A printed circuit may be manufactured from the laminates of this invention by subtractive processes. The subtractive processes include printing a positive image of the circuit pattern on the metal cladding and etching the desired circuit pattern. For printed circuits with conductive patterns on at least two parallel planes connected by plated through holes, the subtractive processes may include the steps of: drilling or otherwise forming through holes, metallizing the through holes and etching the circuit conductor patterns.

In carrying out subtractive processes for manufacturing plated-through hole, printed circuits on thermoplastic base materials according to this invention, hole walls formed in the thermoplastic are preferably adhesion promoted before metallizing same. This is unlike subtractive processes for manufacturing plated-through holes in conventional printed circuit base materials, e.g., copper clad epoxy glass laminate. When attempts are made to manufacture plated-through holes in thermoplastic base materials, the metal layer often does not adhere to the hole walls. This produces blistering or separation of the metal from the hole walls and even may cause metal flaking from the hole walls, leaving voids or otherwise incomplete plated-through holes. According to this invention, after through holes are formed in the metal clad laminate, e.g., by drilling, punching, laser drilling, etc. the hole walls then are adhesion promoted to provide a suitable base for an adherent metallization layer. Adhesion promotion may be accomplished by well known means such as mechanical roughening, plasma or gas etching, or by strong acids, alkalis or oxidizing solutions.

Suitable metals for the metal layers used in the processes of this invention include copper, nickel, aluminum, silver, gold and the platinum group metals, and alloys of these metals. The thickness of the metal layer is not critical, and may be as low as 5 micrometers or as high as 5 millimeters.

The most commonly used metal layer for printed circuits is copper. A copper surface, which will be placed in contact with the base material, should be treated for adhesion. Such treatments include brass and zinc coatings and adherent oxide layers, such as, black oxides and brown oxides.

The process of this invention also is suitable for bonding alternating layers of metal and thermoplastic, e.g., substrates with a reinforced core are useful in making a metal clad thermoplastic with a reinforced metal core. Copper clad thermoplastic substrates with a metal core are useful in making metal core circuit boards and multilayers. Surface layers preferably comprise the same metal while the reinforcing core comprises the same or a different metal with a different treatment for adhesion.

The process of the invention may be used to laminate metal layers to both high and low temperature amorphous thermoplastic polymers. High temperature thermoplastic polymers are preferred for printed circuits. Suitable low temperature polymers are believed to include polymethacrylates, and acrylonitrile-butadiene-styrene copolymers. The thickness of the polymer substrate may be from 0.7 mm to about 7 mm. For many printed circuit board applications, 1.5 or 1.6 mm thick polymer sheets are used, but for flexible printed wiring, 0.13 and 0.25 mm thick polymer films may be used.

Many metal foils or sheets contain internal stresses which may have been imparted to the sheets or foils by the electroforming process or the rolling process used to manufacture the foils. For example, metal foils which have been electrodeposited contain internal tensile stresses. When thermoplastic polymer films or sheets having a thickness above about 0.7 mm ("thick gauge") are employed in accordance with the present invention, the effect of these internal stresses is essentially minimized.

Applicants have found, however, that (1) when thermoplastic polymer films or sheets having a thickness below about 0.7 mm ("thin gauge") or (2) when flexible plastic films having a thickness below about 0.5 mm are clad with metal in accordance with the techniques described herein for thick gauge thermoplastic polymer films or sheets, the metal clad polymer substrate warps, curls and/or distorts after a printed wire pattern is etched on the metal foil. This warping, curling and/or distortion results due to (1) internal stresses inherent in electrodeposited metal foils and (2) differences in the thermal coefficients of expansion (TCE) of the metal foil or sheet being clad and the thermoplastic polymer substrate. Attempts to minimize these undesirable effects by post lamination annealing bakes or by reverse rolling around mandrels have been found to be ineffective with little or no improvement observed.

It has been discovered that the aforementioned undesirable effects of warping, curling and/or distortion can be substantially reduced or even eliminated by the following techniques, alone or in combination. In one technique, a metal foil or sheet of reduced thickness, e.g., equal to or less than 0.017 mm (½ ounce), is employed. Applicants have discovered that the thickness of the metal cladding not only will reduce the mismatch in TCEs between the metal foil or sheet and the thermoplastic substitute but also will reduce internal stresses in the laminate. The ratio of the thickness of the metal foil or sheet to the thickness of the thermoplastic sheet should be selected to minimize the warping, curling and/or distortion induced by internal stresses and differences in the TCEs of the metal foil or sheet and the thermoplastic polymer. For example, with commercially available electrodeposited copper foils and high temperature thin gauge thermoplastic films, applicants prefer a thickness ratio of about 0.03 or below.

In another technique, an annealed metal foil or sheet which is stress-free, such as Roll Annealed copper 0.035 mm (1 ounce copper weight), may be used at a thickness ratio below about 0.1 to substantially minimize or present stress induced distortion on thin gauge thermoplastic polymer films. For multilayer printed circuit applications and/or flexible printed circuit applications, a 0.035 mm 1 ounce Roll Annealed copper cladding is preferred. When subsequent plating is involved, then a thinner gauge copper, e.g., less than 0.017 mm (½ ounce copper weight), may be employed.

The preferred amorphous thermoplastic polymers include polysulfones, polyethersulfones, polyarylsulfones and polyetherimides. The preferred base materials comprise both filled and unfilled polymers. The choice of a filled or unfilled polymer base material depends on the application.

A typical process for the manufacture of double-sided, plated-through hole, printed circuit boards according to this invention is shown as a flow chart in FIG. 1. The starting material for the process may be extruded sheets of amorphous, thermoplastic resins. For many printed circuit board applications, a sheet with a thickness of 1.6 mm may be used. Since flexible printed wiring also may be prepared by the process of this invention, it is clear that the process is not limited to such a thickness or to extruded sheet base materials.

In the first step of the process, extruded sheets of thermoplastic base material are dried before lamination. The drying temperatures may be as low as 100° C. and up to temperatures near the Tg of the thermoplastic resin. Preferably, the drying temperature is below 165° C. When thermoplastic sheets are dried individually, the drying time may be very short. However, it is convenient to dry a stack of sheets at once. When drying a stack of sheets, the stack may be dried for two or more hours. It is very convenient to dry a stack of thermoplastic sheets overnight at 125° C.

The thermoplastic polymer materials used in the processes of this invention are essentially hydrophobic, not soluble in water, and have low water absorption. It is well known that polymer pellets should be dried before molding or extruding polymer articles. If the polymer pellets are not dried, the presence of water may be detected by streaks and bubbles in the extruded or molded article. However, the extruded or molded polymer articles are essentially non-hydroscopic. Polysulfone articles may absorb up to 0.7% water; polyethersulfone articles, up to 1.65%; and polyetherimide up to 1.25%. When a metal layer, such as copper foil, is applied to both sides of a thermoplastic sheet containing low percentages of absorbed water, the initial appearance of the laminate is very good. At a later time, especially any time the laminate is subjected to increased temperatures, such as in soldering printed wiring boards at 230° C. to 290° C., blisters form between the metal layer and the base material. Surprisingly, this problem is avoided by the mild drying step described above. It also may be eliminated by storing the sheets at less than 50% relative humidity. Thus, the drying step is optional if relative humidity of the storage area is sufficiently low.

In the second step of the process as shown in FIG. 1, the dried sheet is laminated to copper foil at a temperature above the glass transition temperature (Tg) of the amorphous thermoplastic polymer. Typical laminating temperatures are shown in the Table below:

| Thermoplastic Polymer | Tg (°C.) | Laminating Temperatures (°C.) at | | |
|---|---|---|---|---|
| | | Minimum | Preferred | Maximum |
| Polysulfone | 190 | 215 | 225 | 235 |
| Polyetherimide | 215 | 220 | 230 | 245 |
| Polyarylsulfone | 220 | 230 | 245 | 260 |
| Polyethersulfone | 230 | 235 | 245 | 260 |

The temperature may be monitored during the lamination process. An extruded sheet of thermoplastic base material, with sheets of copper foil to be laminated to both sides is placed in a laminating press. When the press is closed and laminating pressure and heat applied to the assembly, the temperature is preferably measured at the surface of the thermoplastic sheet. After the thermoplastic sheet reaches the laminating temperature, the temperature and pressure are maintained for at least one minute and preferably, at least three minutes in order to firmly laminate the copper foils to the thermoplastic sheet.

The lamination pressure is not critical. The pressure should be high enough to ensure intimate contact between the thermoplastic polymer sheet and the copper foils, and low enough to prevent thickness variations and squeezing out of a substantial amount of polymer at the edges of the sheet.

After laminating the copper foils to the thermoplastic base materials, about 10 to 20 millimeters may be trimmed from the edges of the sheet.

The third step of the process shown on the flow sheet is heating the copper clad sheet to relieve any stresses set up by the laminating procedure. This is accomplished by heating the laminated material to between about the heat distortion temperature of the polymer and about 50° C. below the heat distortion temperature, preferably 4° C. to 10° C. below the heat distortion temperature. The laminate should be held at the stress relieving or annealing temperature as long as required to ensure that when a conductive pattern is etched on the base material, the base material will not crack or craze, and will remain substantially warp-free. The duration of the stress relieving treatment depends on the polymer, the filler and the temperature. Proper times can be determined by etching conductive patterns in copper clad base materials that have been stress relieved at various times for a given temperature. Four hours is a suitable time for stress relief of laminates at the temperatures shown in the Table below:

| Base Material | Temperature |
|---|---|
| Polysulfone | 170° C. |
| Polyetherimide | 195° C. |
| Polyethersulfone | 200° C. |

In step 4 as shown in the flow chart, holes for plated-through holes are provided in the copper clad base material. These holes may be made by drilling, piercing and the like. Such procedures are well known in the printed circuit art.

In step 5, the walls of the holes are treated to promote adhesion of subsequent electroless metal deposits.

One method of treating the hole walls to provide a suitable base for adherent metallization is to adhesion promote the hole walls by the swell and etch technique. The hole walls in the base material are contacted with a solvent mixture such as dimethylformamide and isopropanol to swell the hole walls, the hole walls are then contacted with an oxidizer such as a chromic acid solution or an alkaline permanganate solution. The oxidizing solution is selected to avoid etching the laminated metal layer of the base material. For most metal layers, an aqueous solution of about 400-900 grams chromium trioxide per liter at 23° C. to 60° C. may be used; or an aqueous solution of 40 to 60 grams per liter of potassium permanganate at 40 to 60° C. and a pH of 12 to 13.5 also may be used.

Many manufacturing facilities are not equipped to waste treat the swell and etch solutions or the rinses therefrom. Alternatively, mechanical treatments like sandblasting, liquid or vapor honing with an abrasive or pumice slurry will sufficiently texture the hole walls so as to render them receptive to adherent electroless deposition.

As shown in the sixth step in FIG. 1, the hole walls are metallized by well known procedures. Such procedures include activating the hole walls with palladium-tin chloride activators and electrolessly plating thin film of metal. Alternatively, the hole walls may be activated with non-noble metal activators for electroless deposition.

If the printed wiring board is to be manufactured by the panel plating process, this step would include additional hole wall plating to deposit the finished metal thickness on the hole walls, e.g., 25 micrometers of copper.

In the next step, when the hole walls have been adherently metallized, the image of the printed circuit pattern is printed with a resist on the panel. Printing procedures are well known in the art and include both screen printing and photoprinting. Since the most of the thermoplastic base materials are sensitive to many solvents, it is preferable to establish the resist image for plating or etching with aqueous strippable resists. Such resists are well known.

The step of plating after imaging is optional, and is normally employed in the pattern plating process, when the plated through holes were not plated with the full thickness of metal in step 6.

In the next step, the printed circuit panel may be further processed by well known means. This processing includes etching to remove the unwanted portions of the laminated metal layer between the desired printed circuit conductors.

Subsequent to the removal of the unwanted metal, the bond strength of the conductors, especially the small conductors, is enhanced by contacting the surface of the base material with a solvent for the material and then rapidly evaporating the solvent from the surface in order to flow the some of the base material against the edges of the conductors. The surface is contacted with solvent for a time period brief enough to prevent crazing of the surface or flow of solvated base material over the conductors. The evaporation is accomplished at temperatures high enough to rapidly remove the solvent and sufficient to secure a bond between the base material and the edges of the conductors.

Processes by which the bond strength is enhanced are disclosed in our U.S. Application entitled "Process for the Photoselective Metallization on Non-Conductive Plastic Base Materials", filed Oct. 29, 1984, now U.S. Pat. No. 4,594,311, the disclosure of which is incorporated herein by reference. Therein, there is described the enhancement of bond strength by flowing the base material against edges of conductors. Enhancement is more significant for small conductors where the extra bond provided at the edges constitutes a greater percentage of the polymer surface bonded to metal and hence, a greater percentage of the total bond strength Thus, for conductor lines of about 0.8 mm in width, the bond strength is increased, on average, by 5 to 15%. For conductor lines of about 0.2 mm in width, the bond strength is increased, on average, by 10% to 30%.

The enhancement of bond strength may be accomplished by immersing the polymer base material in a solvent in which the polymer is at least partially soluble and for a time period sufficient to solvate the polymer surface but insufficient to result in stress cracking or flow of the polymer onto the metal pattern. The time period will vary between about 1 second and about 1 minute depending on the solvent system selected and the polymer system being treated. The solvent systems include a strong solvent for the polymer and suitable diluents. Among the diluents are aliphatic hydrocarbons, aliphatic alcohols and water. Immediately after being contacted with the solvent, the polymer surface is dried at a temperature at which the solvent rapidly volatilizes. The drying temperature is from room temperature up to about 200° C. depending upon the polymers and the solvent system used. Preferably, the drying temperature is between about room temperature and about 125° C.

The immersion may be in a liquid solvent such as ketones, esters, aromatic or aprotic solvents, or in solvent vapors of halogenated hydrocarbons with boiling points below the heat distortion temperature of the polymer.

The solvent selected will vary depending on the polymeric surface. For high temperature thermoplastics, a dilute solvent solution at room temperature of isopropyl alcohol (IPA) and dimethylformamide (DMF) may be used. The ratio of DMF and IPA will vary depending upon the specific thermoplastic polymer involved. For example, when solvating a polysulfone surface, about 80% DMF may be used. However, in general, the ratio of DMF to IPA will range from 50% to 90% by volume. For epoxy surfaces, such as resin-rich epoxy laminates and epoxy coated metal core substrates, 100% DMF may be used. In certain instances, e.g., polyetherimide surfaces, it may be necessary to heat the DMF/IPA solution to a temperature from about 35° C. to about 65° C. to solvate the surface.

The time period the polymeric surface is exposed to the solvent is critical. Excessive immersion time may result in stress cracking or flow of thermoplastic resin onto the printed circuit pattern. Typically, exposure time periods of from 1 to 10 seconds are adequate to solvate the surface. Exposure time periods over a minute, even with very low concentrations of the strong solvent (DMF), lead to streaking or running of the thermoplastic. In general, an exposure times period below about 30 seconds is preferred, more preferrably below about 20 seconds.

Immediately upon removal of the polymeric substrate from exposure to the solvent, the polymeric surface should be dried. Convection or infrared/convection oven combinations may be employed for drying. Solvating the surface enables the surface region of the thermoplastic base material to flow against the edges of the conductors. The application of heat in drying the solvated surface improves the flow. Drying temperatures, after exposure to liquid solvents, are preferably between about 60° C. and about 200° C.

Prolonged delays after discontinuing solvent exposure and before beginning drying will give rise to a light haze or frosting condition. Properly treated surfaces will appear smooth and even translucent or transparent in the case of unfilled or unpigmented high temperature thermoplastics which are translucent or transparent prior to laminating metal to the thermoplastic substrates. Similarly, if a high temperature thermoplastic initially contains a pigment, treatment of its exposed surface will restore its initial color.

An alternative to solvent immersion involves exposing the surface to solvent vapors similar to those used in a vapor degreasing procedure. It has been found that a methylene chloride vapor will totally restore many thermoplastic surfaces to a smooth condition and flow solvated resin against the edges of the conductors without the application of additional heat above room temperature. Subsequent oven baking is preferred to ensure total removal of residual solvents, bound water and to relieve any stresses induced. Alternate solvent vapor systems are believed to include trichlorethane, trifluorotrichloroethane and blends thereof with methylene chloride (commercially available as FREON TMC TM from E. I. DuPont de Nemours & Co., Inc.).

The final stages in the manufacture of a printed wiring board are carried out in step 11. This could include tab plating, applying solder mask and legends, and fabricating to the final part outline.

Figure 2A:
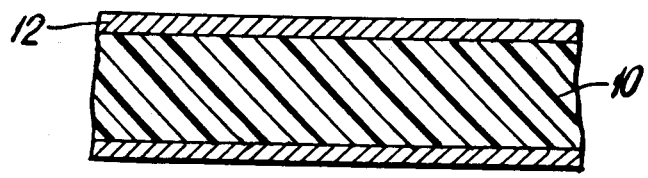
FIG. 2 is a side view in cross section of the steps in manufacturing a printed wiring board from the metal clad laminates.

Referring to FIG. 2A there is shown an insulating blank 10 bonded on both sides with copper foil 12. The blank 10 comprises a sulfone polymer.

Figure 2B:
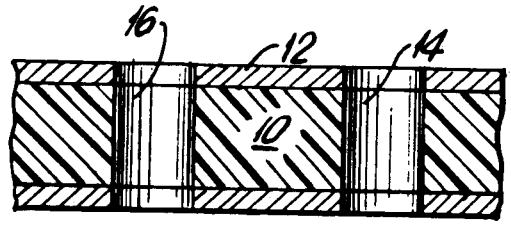

In FIG. 2B, holes 14 and 16 are drilled through the blank 10.

Figure 2C:
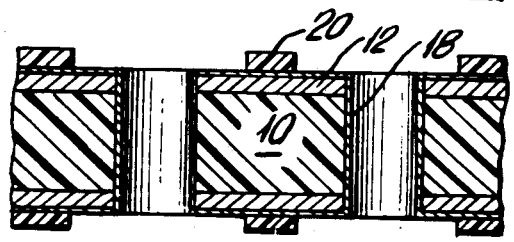

As shown in FIG. 2C, after holes 14 and 16 were made, the blank 10 is metallized overall with a thin layer of electrolessly deposited copper 18 and printed with a negative resist image 20 for pattern plating.

Figure 2D:
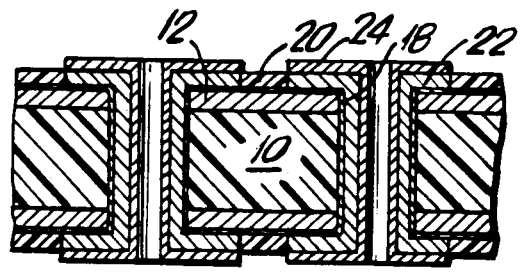

In FIG. 2D, the blank 10 is plated electrolytically with a copper layer 22 and tin-lead alloy 24.

Figure 2E:
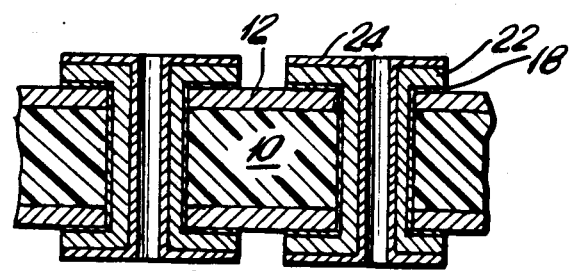

As shown in FIG. 2E, the resist 20 has been removed exposing the underlying copper foil 12 which will be subsequently etched in the next step.

Figure 2F:
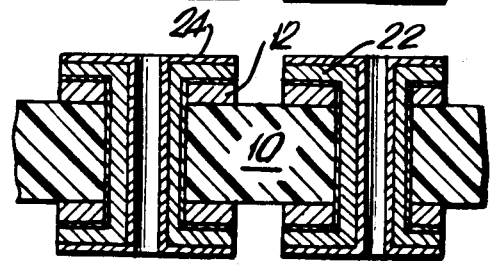

In FIG. 2F, the blank 10 has been immersed in a copper etching solution wherein the underlying copper foil 12 is chemically dissolved thereby delineating the desired circuit pattern.

Figure 2G:
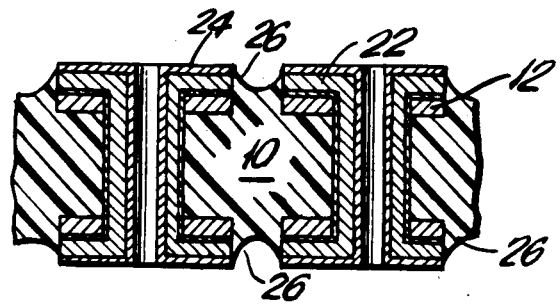

As shown in FIG. 2G, the blank 10 has been immersed in a solution containing 80% N, N-dimethylformamide and 20% isopropanol. Following removal of the blank 10 from the chemical solution, the solvent has been rapidly volatilized. During the procedure of solvent immersion and rapid drying, the surface of the sulfone polymer 26 has flowed up onto the edges of copper circuitry 12 and 22.

EXAMPLE I

Six polyetherimide (Ultem TM Commercially available from General Electric Co., Pittsfield MA) sheets of various thicknesses and sized 450 mm×600 mm were dried overnight at 125° C. and laminated on both sides with copper foils of various thicknesses a temperature of 230° C. for 10 minutes at a pressure of 4.3 MPa 633 psi. The laminated materials were heated for four hours at 195° C. to relieve any stresses set up by the laminating step. A circuit pattern was applied by print and etch processing.

As shown in the Table below, the laminated materials having etched wiring patterns after print and etch processing in which the thickness ratio was below about 0.03 were found to be virtually flat whereas those in which the thickness ratio was above 0.03 were found to distort.

| Sample | Electrodeposited Copper Foil | | Polyetherimide Base Thickness | | Thickness Ratio | |
|---|---|---|---|---|---|---|
| | Foil Thickness | | | | | |
| | Oz | mm | mils | mm | Foil/Base | Flatness |
| A | | 0.005 | 0.015 | 0.380 | 0.013 | flat |
| B | ½ | 0.017 | 0.015 | 0.380 | 0.045 | distorted |
| C | 1 | 0.035 | 0.015 | 0.380 | 0.092 | distorted |
| D | ½ | 0.017 | 0.030 | 0.760 | 0.022 | virtually flat |
| E | 1 | 0.035 | 0.030 | 0.760 | 0.046 | distorted |
| F | 1 | 0.035 | 0.045 | 1.140 | 0.030 | flat |

EXAMPLE II

Example I was repeated using a roll annealed 0.035 mm thick 1 ounce copper foil (35 m thickness), controls with 0.035 mm thick (102) electrodeposited copper foil and both 0.76 mm and 0.380 mm polyetherimide foils were prepared at the same time. Polyetherimide substrates having thicknesses of 0.76 mm (0.03 inch) and 0.38 mm (0.015 inch) and thickness ratios of 0.092 and 0.046, respectively. The results, after printing and etching, were that the stress-free roll annealed copper produced warp and twist-free (flat) sheets and flexible films whereas the etched sheets made with the 0.035 mm (1 ounce) copper foil controls were curled and twisted.

EXAMPLE III

Example II was repeated using polysulfone sheets (UDEL PSF commercially available from Union Carbide Corporation, Danbury, Connecticut). Similar results were obtained.

What is claimed is:

1. A process for the production of a metal clad thermoplastic polymer substrate comprising the steps of:

in a first step providing a thermoplastic polymer film or sheet having an absorbed volatiles content below about 0.1% by weight, said volatiles having boiling below about 245° C., by heating said film or sheet between 100 and 165° C. for at least 30 minutes;

providing a copper metal foil or sheet, the thermoplastic film or sheet having a thickness below about 0.7 mm and the ratio of the thickness of the metal foil to the thermoplastic film is 0.03 or below;

in a subsequent step superimposing said metal foil on said thermoplastic polymer film or sheet; and consolidating the assembly so produced by applying pressure to the assembly, at a temperature between about 2° C. and about 45° C. above the glass transition temperature (Tg) of the thermoplastic polymer, for a time period sufficient to firmly laminate the metal foil or sheet to the thermoplastic polymer film or sheet forming a metal clad thermoplastic base which is flat and of substantially uniform thickness.

2. A process as defined in claim 32 wherein the thermoplastic film or polymer is a flexible plastic having a thickness below about .05 mm.

3. A process as defined in claim 32 wherein to minimize warping, curling and distortion induced by internal stresses of the metal foil or sheet and the thermoplastic polymer after the consolidation step, annealing the metal clad laminate at a temperature from about 50° C. below up to about the heat distortion temperature of said thermoplastic polymer to stress relieve the metal clad laminate.

4. A process for the production of a metal clad thermoplastic polymer substrate comprising the steps of:

in a first step providing a thermoplastic polymer film or sheet having an absorbed volatiles content below about 0.1% by weight, said volatiles having boiling points below about 245° C., by heating said film or sheet to a temperature between 65° C. and 165° C. and below the deflection temperature of the thermoplastic polymer under a 1.82 MPa flexural load for at least 30 minutes;

providing a metal foil or sheet, the metal foil or sheet being a rolled, annealed copper foil and the ratio of the thickness of the metal foil to the thermoplastic film or sheet being 0.1 or below;

in a subsequent step superimposing said metal foil on said thermoplastic polymer film or sheet; and consolidating the assembly so produced by applying pressure to the assembly, at a temperature between about 2° C. and about 45° C. above the glass transition temperature (Tg) of the thermoplastic polymer, for a time period sufficient to firmly laminate the metal foil or sheet to the thermoplastic polymer film or sheet forming a metal clad thermoplastic base which is flat and of substantially uniform thickness.

5. A process for the production of a metal clad thermoplastic polymer substrate comprising the steps of:

in a first step providing a thermoplastic polymer film or sheet having an absorbed moisture content below about 0.1% by weight, by storing said film or sheet for at least two weeks at a relative humidity below 50%;

providing a copper metal foil or sheet;

the thermoplastic film or sheet having a thickness below about 0.7 mm and the ratio of the thickness of the metal foil to the thermoplastic film is 0.03 or below;

in a subsequent step superimposing said metal foil on said thermoplastic polymer film or sheet; and consolidating the assembly so produced by applying pressure to the assembly, at a temperature between about 2° C. and about 45° C. above the glass transition temperature (Tg) of the thermoplastic polymer, for a time period sufficient to firmly laminate the metal foil or sheet to the thermoplastic polymer film or sheet forming a metal clad thermoplastic base which is flat and of substantially uniform thickness.

6. A process for the production of a metal clad thermoplastic polymer substrate comprising the steps of:

in a first step providing a thermoplastic polymer film or sheet having an absorbed moisture content below about 0.1% by weight by storing said film or sheet for at least two weeks at a relatively humidity below 50%;

providing a metal foil or sheet, the metal foil or sheet being a rolled, annealed copper foil and the ratio of the thickness of the metal foil to the thermoplastic film or sheet being 0.1 or below;

in a subsequent step superimposing said metal foil on said thermoplastic polymer film or sheet; and consolidating the assembly so produced by applying pressure to the assembly, at a temperature between about 2° C. and about 45° C. above the glass transition temperature (Tg) of the thermoplastic polymer, for a time period sufficient to firmly laminate the metal foil or sheet to the thermoplastic polymer film or sheet forming a metal clad thermoplastic base which is flat and of substantially uniform thickness.

* * * * *

UNITED STATES PATENT AND TRADEMARK OFFICE
CERTIFICATE OF CORRECTION

PATENT NO. : 5,047,114
DATED : September 10, 1991
INVENTOR(S) : David C. Frisch and Wilhelm Weber It is certified that error appears in the above-identified patent and that said Letters Patent is hereby corrected as shown below:

In The Claims:

Claim 2, col. 12, line 22, "32" should read --1--.

Claim 2, col. 12, line 24, ".05 mm" should read --0.5 mm--.

Claim 3, col. 12, line 25, "32" should read --1--.

Claim 6, col. 14, line 1, "relatively" should read --relative--.

Signed and Sealed this

Twentieth Day of July, 1993

Attest:

MICHAEL K. KIRK

Attesting Officer  Acting Commissioner of Patents and Trademarks